(12) United States Patent
Fiscus

(10) Patent No.: US 6,714,473 B1
(45) Date of Patent: Mar. 30, 2004

(54) METHOD AND ARCHITECTURE FOR REFRESHING A 1T MEMORY PROPORTIONAL TO TEMPERATURE

(75) Inventor: Timothy E. Fiscus, South Burlington, VT (US)

(73) Assignee: Cypress Semiconductor Corp., San Jose, CA (US)

( * ) Notice: Subject to any disclaimer, the term of this patent is extended or adjusted under 35 U.S.C. 154(b) by 83 days.

(21) Appl. No.: 09/998,094

(22) Filed: Nov. 30, 2001

(51) Int. Cl.$^7$ ................................................ G11C 7/00
(52) U.S. Cl. ........................ 365/222; 365/204; 365/210; 365/185.24; 365/185.25
(58) Field of Search ................................ 365/222, 204, 365/210, 185.24, 185.25

(56) References Cited

U.S. PATENT DOCUMENTS

| | | | |
|---|---|---|---|
| 4,682,306 A | 7/1987 | Sakurai et al. ............... | 365/222 |
| 4,982,369 A | * 1/1991 | Tatematsu ..................... | 365/222 |
| 5,272,676 A | 12/1993 | Kubono et al. .............. | 365/222 |
| 5,495,452 A | 2/1996 | Cha ............................. | 365/222 |
| 5,539,690 A | 7/1996 | Talreja et al. ........... | 365/185.22 |
| 5,652,729 A | 7/1997 | Iwata et al. .................. | 365/222 |
| 5,680,359 A | 10/1997 | Jeong .......................... | 365/222 |
| 5,784,328 A | 7/1998 | Irrinki et al. ............... | 365/222 |
| 5,852,582 A | * 12/1998 | Cleveland et al. ........... | 365/222 |
| 5,889,718 A | 3/1999 | Kitamoto et al. ........... | 365/210 |
| 6,038,187 A | 3/2000 | El Hajji ...................... | 365/222 |
| 6,075,739 A | 6/2000 | Ihara ........................... | 365/222 |
| 6,154,408 A | 11/2000 | Yuh ............................ | 365/222 |
| 6,229,747 B1 | * 5/2001 | Cho et al. ................... | 365/222 |
| 6,269,039 B1 | 7/2001 | Glossner, III et al. ...... | 365/210 |
| 6,281,760 B1 | 8/2001 | Koelling et al. ............ | 331/66 |
| 6,304,148 B1 | 10/2001 | Nomura et al. .............. | 331/57 |
| 6,483,764 B2 | * 11/2002 | Chen Hsu et al. .......... | 365/222 |

* cited by examiner

*Primary Examiner*—Connie C. Yoha
(74) *Attorney, Agent, or Firm*—Christopher P. Maiorana, P.C.

(57) ABSTRACT

An apparatus comprising an array of memory cells, a refresh circuit, a first monitor cell, a second monitor cell, and a control circuit. The refresh circuit may be configured to refresh the array of memory cells in response to a refresh control signal. The first monitor cell may be configured to have a charge leakage similar to the memory cells. The second monitor cell may be configured to have a discharge leakage similar to the memory cells. The control circuit may be configured to generate the refresh control signal in response to either a voltage level of the first monitor cell rising above a first pre-determined threshold level or a voltage level of the second monitor cell dropping below a second pre-determined threshold level, where the first and second threshold levels are different.

20 Claims, 4 Drawing Sheets

METHOD AND ARCHITECTURE FOR REFRESHING A 1T MEMORY PROPORTIONAL TO TEMPERATURE

FIELD OF THE INVENTION

The present invention relates to a method and/or architecture for refreshing a memory generally and, more particularly, to a method and/or architecture for refreshing a 1T memory proportional to temperature.

BACKGROUND OF THE INVENTION

Data (e.g., a "1" or a "0") is stored in a 1T memory cell as a voltage level. A "1" is stored as a high voltage level which can decrease due to leakage. A "0" is stored as a voltage level of zero volts which can increase due to leakage. The 1T memory cell requires a periodic refresh to maintain the voltage level stored in the cell. In many applications, a memory chip uses a ring oscillator to control when the refreshes occur. The frequency of a signal generated by a typical ring oscillator decreases with increasing temperature because of CMOS device characteristics. However, the memory cell leakage increases with temperature. As the temperature increases, refresh using a conventional oscillator can occur less frequently than necessary to maintain the voltage level stored in the memory cell. Thus, the oscillator needs to be designed to support the high temperature refresh rate at the expense of more current.

One method of providing more frequent refreshing is to use a proportional to temperature voltage or current to control the frequency of the refresh oscillator. As the temperature increases, the voltage increases which increases the frequency of the oscillator and the refresh happens more often. For example, a proportional to absolute temperature (PTAT) voltage reference can be used to control a current starved inverter ring oscillator to generate a clock that is proportional to temperature.

One problem with using a PTAT voltage reference is that for low supply voltages (e.g., <1.8V) typical PTAT generators do not operate. Thus, the design must use more complicated low voltage reference generators. Another downside to using the above approach is that the refresh rate is based upon the cell leakage and the refresh rate, which cannot be matched well, is only approximated by a PTAT generator. A memory refresh operation controlled in response to the leakage of the memory cells would be desirable.

SUMMARY OF THE INVENTION

The present invention concerns an apparatus comprising an array of memory cells, a refresh circuit, a first monitor cell, a second monitor cell, and a control circuit. The refresh circuit may be configured to refresh the array of memory cells in response to a refresh control signal. The first monitor cell may be configured to have a charge leakage similar to the memory cells. The second monitor cell may be configured to have a discharge leakage similar to the memory cells. The control circuit may be configured to generate the refresh control signal in response to either a voltage level of the first monitor cell rising above a first pre-determined threshold level or a voltage level of the second monitor cell dropping below a second pre-determined threshold level, where the first and second threshold levels are different.

The objects, features and advantages of the present invention include providing a method and/or architecture for refreshing a memory proportional to temperature that may (i) use pairs of memory cells to determine when a refresh occurs, (ii) use one memory cell that stores a "1" and monitors any discharge leakage, (iii) use one memory cell that stores a "0" and monitors any charging leakage, (iv) use an array of memory cells to monitor when the refresh occurs for memory redundancy and for weaker cells and/or (v) operate with supply voltages below 1.8V.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
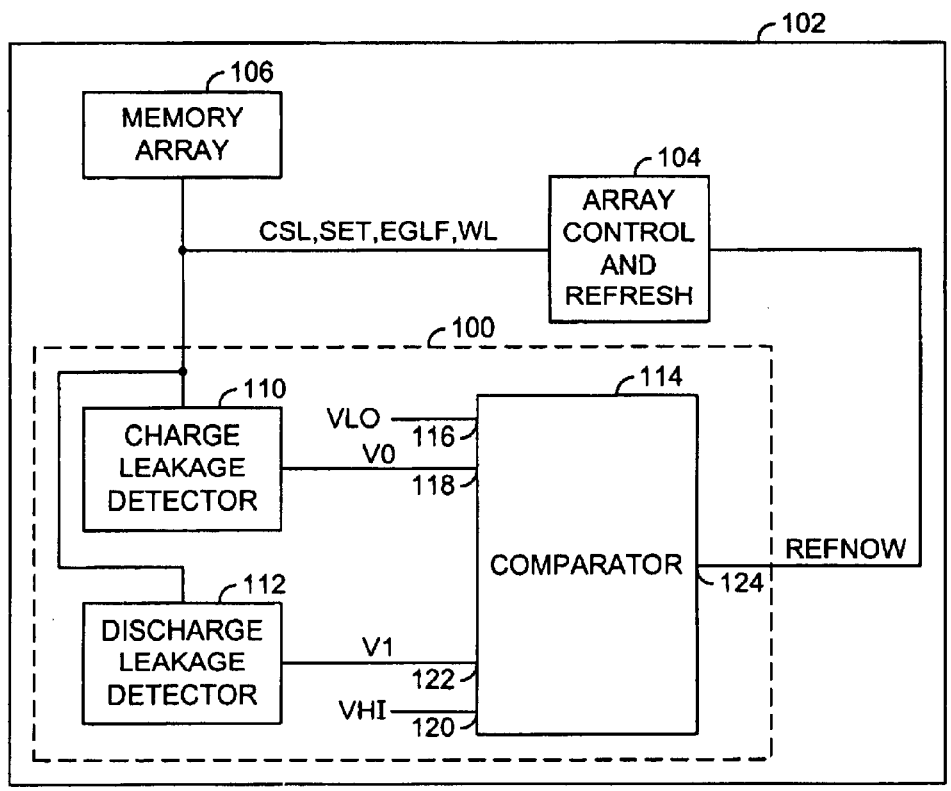
FIG. 1 is a block diagram of a preferred embodiment of the present invention.

Referring to FIG. 1, a block diagram of a circuit 100 is shown in accordance with a preferred embodiment of the present invention. The circuit 100 may be implemented as a refresh control circuit of a memory device 102. The circuit 100 may be configured to generate a signal (e.g., REFNOW) that may be used to initiate a refresh operation of the memory device 102. The signal REFNOW may be presented to a circuit 104. The circuit 104 may be implemented as an array control and refresh circuit. The circuit 104 may be configured to schedule a refresh of a memory array 106 in response to the signal REFNOW. For example, when the memory array 106 is being accessed, a refresh may be delayed until the access is finished. The circuit 104 may be configured to keep track of when the memory array 106 is being refreshed and will generally start a refresh cycle when the signal REFNOW is asserted and the memory array 106 is available. The circuit 104 may be further configured to generate a number of control signals (e.g., CSL, SETN, SETP, EQLP, WL, etc.). The signals CSL, SETN, SETP, EQLP, WL, etc. may be used to control operations of the memory array 106 and the circuit 100.

The circuit 100 may comprise a circuit 110, a circuit 112, and a circuit 114. The circuit 110 may be implemented as a charge leakage detector. The circuit 112 may be implemented as a discharge leakage detector. The circuit 114 may be implemented as a comparator circuit. The circuit 110 may have an input that may receive the signals CSL, SETN, SETP, EQLP, and WL and an output that may present a signal (e.g., V0). The circuit 112 may have an input that may receive the signals CSL, SETN, SETP, EQLP, and WL and an output that may present a signal (e.g., V1). The signals V0 and V1 may represent storage node voltages of memory cells in the memory array 106. For example, the signal V0 may represent a storage node voltage of a memory cell programmed with a first binary value (e.g., a binary "0"). The signal V1 may represent a storage node voltage of a memory cell programmed with a second binary value (e.g., a binary "1"). The circuit 114 may have an input 116 that may receive a first reference voltage (e.g., VLO), an input 118 that may receive the signal V0, an input 120 that may receive a second reference voltage (e.g., VHI), an input 122 that may receive the signal V1 and an output 124 that may present the signal REFNOW. The circuit 114 may be configured to generate the signal REFNOW in response to the signals V0, VLO, V1, and VHI.

Figure 2:
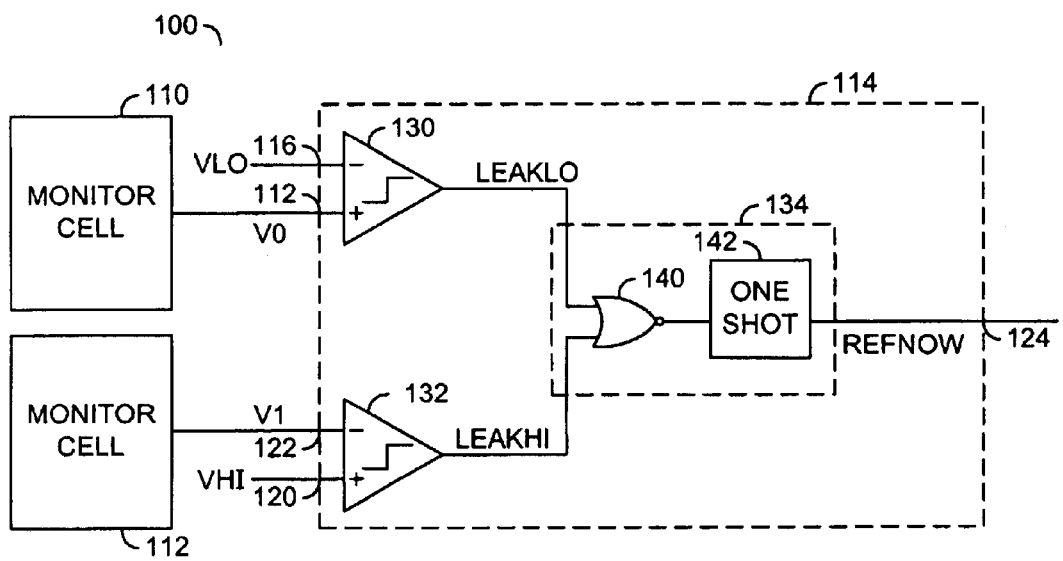
FIG. 2 is a more detailed block diagram of a preferred embodiment of the present invention.

Referring to FIG. 2, a more detailed block diagram of the circuit 100 is shown. The circuit 110 may be implemented as a monitor cell. The monitor cell 110 may be configured to generate the signal V0 in response to binary data stored within the cell. The signal V0 may represent a voltage level of a storage node of the memory cell 110. The monitor cell 110 may be configured to have the same performance as a memory cell of the memory array 106.

The circuit 112 may be implemented as a monitor cell. The monitor cell 112 may be configured to generate the signal V1 in response to binary data stored within the cell. The signal V1 may represent a voltage level of a storage node of the monitor cell 112. The monitor cell 112 may be configured to perform similarly to a memory cell of the memory array 106.

The circuit 114 may comprise a circuit 130, a circuit 132, and a circuit 134. The circuits 130 and 132 may be implemented as comparator circuits. The circuit 134 may be implemented, in one example, as a logic circuit. The signal V0 may be presented to a first input of the comparator 130. The reference voltage VLO may be presented to a second input of the comparator 130. The comparator 130 may be configured to generate a signal (e.g., LEAKLO) in response to the signals V0 and VLO. The signal V1 may be presented to a first input of the comparator 132. The signal VHI may be presented to a second input of the comparator 132. The comparator 132 may be configured to generate a signal (e.g., LEAKHI) in response to the signals VHI and V1. The signal LEAKLO may have a first state (e.g., de-asserted) when the signal V0 is less than the reference level VLO and a second state (e.g., asserted) when the signal V0 is greater than the reference level VLO. The signal LEAKHI may have a first state (e.g., de-asserted) when the signal V1 is greater than the reference level VHI and a second state (e.g., asserted) when the signal V1 is less than the reference level VHI. In one example, the reference voltages VLO and VHI may be around 20 mV to 100 mV. However, other values may be selected to meet the design of a particular application.

The circuit 134 may have a first input that may receive the signal LEAKLO, a second input that may receive the signal LEAKHI and an output that may present the signal REFNOW. The circuit 134 may be configured to generate the signal REFNOW in response to the signals LEAKLO and LEAKHI. In one example, the circuit 134 may be configured to generate the signal REFNOW with a predetermined pulse width. The pulse width may be selected to meet the design criteria of a particular application.

The circuit 134 may comprise, in one example, a logic gate 140 and a one-shot circuit 142. Alternatively, when multiple circuits 100 are implemented (described in more detail in connection with FIG. 6), the one-shot circuit 142 may be omitted. The gate 140 may be implemented, in one example, as a 2-input NOR gate. However, other types of logic gates may be implemented accordingly to meet the design criteria of a particular application. The signal LEAKLO may be presented to a first input of the gate 140. The signal LEAKHI may be presented to a second input of the gate 140. An output of the gate 140 may be presented to an input of the circuit 142. The circuit 142 may have an output that may present the signal REFNOW. The circuit 142 may be configured to generate the signal REFNOW in response to the output of the gate 140. The circuit 142 may be configured to generate the signal REFNOW with a predetermined pulse width.

Figure 3:
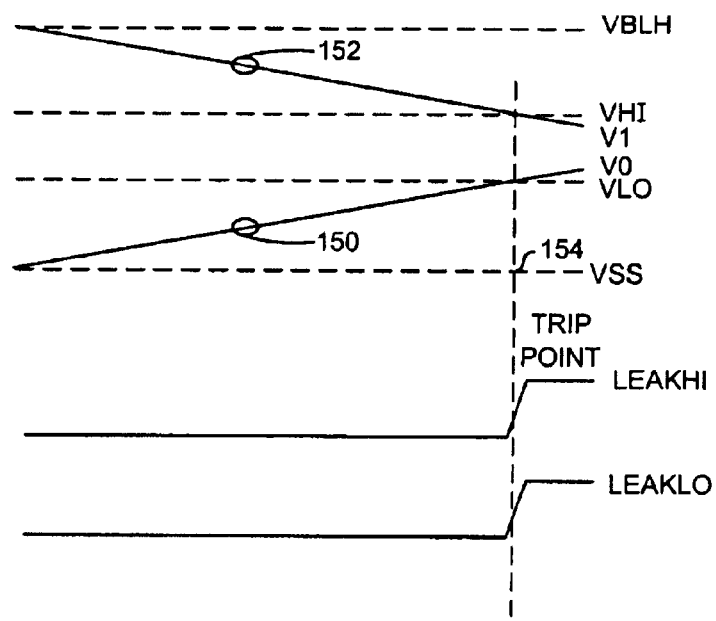
FIG. 3 is a timing diagram illustrating an example operation of the present invention.

Referring to FIG. 3, a timing diagram illustrating an example operation of the circuit 100 of FIG. 2 is shown. The monitor cell 110 may be programmed with a binary "0" that may be represented by a voltage level approximately equal to a supply ground (e.g., VSS). The monitor cell 112 may be programmed with a binary "1" represented by a voltage level approximately equal to a bitline high supply voltage (e.g., VBLH). As time passes, voltage levels of the storage nodes of the monitor cell 110 and the monitor cell 112 may change due to leakage (e.g., the traces 150 and 152 respectively). The monitor cell voltages may continue to change until a trip point is reached (e.g., the point 154) where one or both of the signals V0 and V1 exceed the respective reference levels VLO and VHI. At the trip point 154, the signal LEAKLO and/or the signal LEAKHI may switch from a first logic state to a second logic state to indicate that the voltage level of the corresponding monitor cell 110 and 112 has exceeded the respective reference voltages VLO and VHI.

Figure 4:
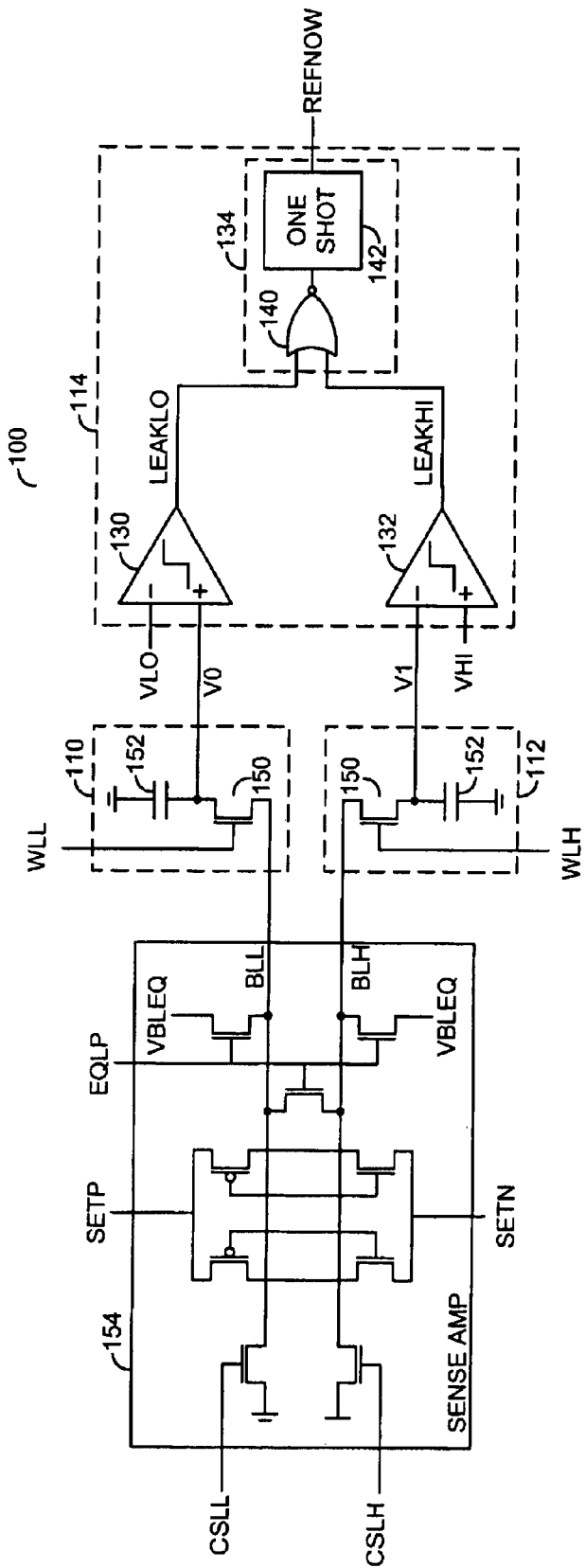
FIG. 4 is a more detailed block diagram of a preferred embodiment of the present invention.

Referring to FIG. 4, a more detailed block diagram of a preferred embodiment of the present invention is shown. The monitor cells 110 and 112 may be implemented as 1T memory cells. The monitor cells may be implemented structurally similar to memory cells of the memory array 106. The monitor cells 110 and 112 may be configured in such that the environment of the monitor cells is similar to the memory array 106. Some examples may include: (i) a capacitor storage node of the monitor cells may be monitored; (ii) bitlines of the monitor cells may be equalized similarly to the memory cells of the memory array 106 during monitoring; (iii) word lines and column multiplexers connected to the monitor cells may be off and precharged. In one example, the monitor cells 110 and 112 may be implemented as part of the memory array 106.

The monitor cells 110 and 112 may comprise a transistor 150 and a capacitor 152. A first source/drain of the transistor 150 may be configured to receive a bitline signal (e.g., BLL or BLH). A gate of the transistor 150 may be configured to receive a word line signal (e.g., WLL or WLH). A second source/drain of the transistor 150 may be connected to a first terminal of the capacitor 152. A second terminal of the capacitor 152 may be connected to the ground potential VSS. The signals V0 and V1 may be presented at a node formed by the connection between the transistor 150 and the capacitor 152 of the respective monitor cells 110 and 112.

The bitline signals BLL and BLH may be generated by a circuit 154. The circuit 154 may be implemented as a sense amplifier. The circuit 154 may be configured to receive a first column select signal (e.g., CSLL), a second column select signal (e.g., CSLH), a control signal (e.g., SETP), a second control signal (e.g., SETN), a third control signal (e.g., EQLP), and a equalization supply voltage (e.g., VBLEQ). The circuit 154 may be configured to present the bitline signals BLL and BLH to the monitor cells 110 and 112. The circuit 154 may be configured to set the memory cells 110 and 112 to a binary "0" and a binary "1", respectively, in response to the signals SETP and SETN.

Figure 5:
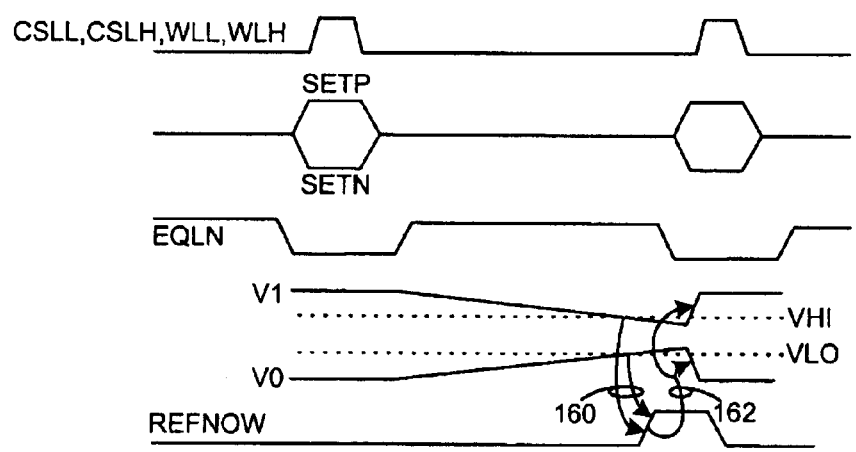
FIG. 5 is a timing diagram illustrating various signals of FIG. 3.

Referring to FIG. 5, a timing diagram illustrating various example signals of FIG. 4 is shown. In general, when the signals CSLL, CSLH, WLL, WLH, and SETP are set, in one example, to a logic HIGH state and the signals SETN and EQLN are set, in one example, to a logic LOW state, the monitor cells 110 and 112 are generally programmed with the respective binary values "0" and "1". The monitor cells 110 and 112 may be programmed, for example, following power-up and in response to a refresh. As time passes, the voltage levels on the monitor cells 110 and 112 may change due to leakage. When the voltage level of the monitor cell 110 and/or the monitor cell 112 exceeds the respective reference voltages VLO and VHI, the signal REFNOW is generally generated (e.g., the arrows 160). The circuit 100 may be configured to refresh the contents of the monitor cells 110 and 112 in response to the signal REFNOW (e.g., the arrows 162). When the monitor cells 110 and 112 have been refreshed, monitoring of the signals V0 and V1 may begin again.

Figure 6:
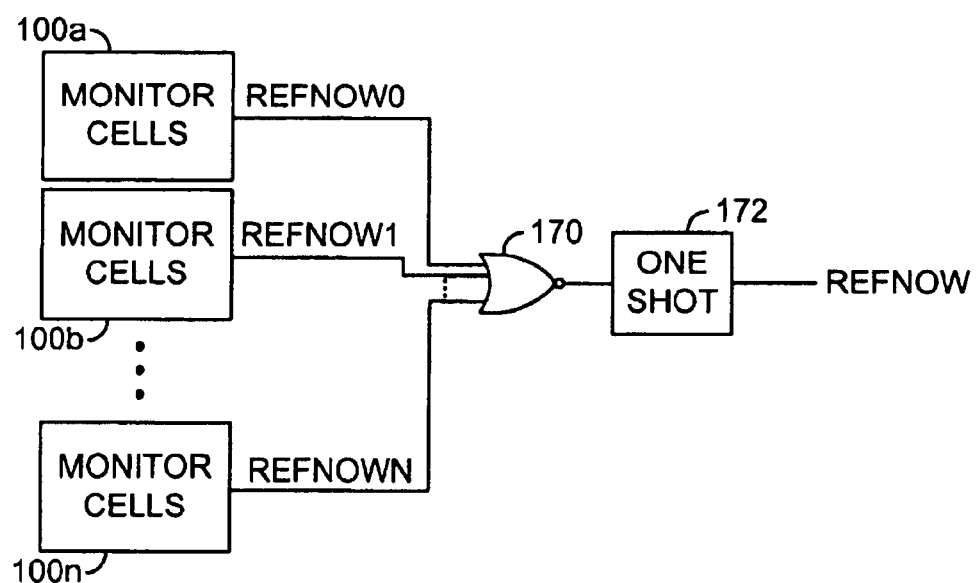
FIG. 6 is a block diagram of another preferred embodiment of the present invention.

Referring to FIG. 6, a block diagram illustrating another preferred embodiment of the present invention is shown. The memory circuit 102 may be implemented with a number of circuits 100a–100n. Each of the circuits 100a–100n may be implemented similarly to the circuit 100. An output of each of the circuits 100a–100n may present a signal (e.g., REFNOW0–REFNOWn) to, in one example, an input of a logic gate 170. The logic gate 170 may be implemented, in one example, as a N-input NOR gate. However, other types of gates may be implemented accordingly to meet the design criteria of a particular application. The logic gate 170 may be configured to generate the signal REFNOW in response to the signals REFNOW0–REFNOWn. A one-shot circuit 172 may be configured to receive the output of the gate 170 and generate the signal REFNOW with a predetermined pulse width.

The present invention may provide a method of refreshing a memory device by monitoring the leakage in a pair of monitor cells with complementary programming and refreshing the memory when a voltage of either monitor cell exceeds a respective reference voltage. Since the cell can leak up (charge) or down (discharge), a monitor cell with a "0" stored and a monitor cell with a "1" stored are generally implemented. The memory voltage V0, which is generally set as a "0", may be compared with the reference voltage level VLO using a comparator. When the voltage V0 rises above VLO, the signal LEAKLO generally activates the refresh operation. The memory voltage V1, which is generally set as a "1", may be compared with the second reference level VHI using a comparator. When the voltage V1 falls below the reference level VHI, the signal LEAKHI generally activates the refresh operation. After the signal REFNOW is presented, the monitor cells are generally reset to store the respective values "0" and "1" and the monitoring starts over. The implementation of two different references may allow detection of both asymmetrical and symmetrical charge/discharge leakage.

The present invention may implement a sense amplifier that always sets the same way to store a "0" and a "1" into the monitor cells. By asserting the signals CSLL, CSLH, WLL, and WLH (e.g., HIGH) and setting the sense amplifier (e.g., asserting the signal SETP HIGH and the signal SETN LOW) a "0" may be written into V0 and a "1" may be written into V1. The pulse width of the signals WLL and WLH may be based on the normal timing of the memory array 106 to allow a full signal to be written into the monitor cells. Once the full signal is written into the monitor cells, the signals WLL and WLH may be turned off (de-asserted) and the monitor cell voltages monitored. After the signals WLL and WLH are deasserted and the sense amplifier 154 set signals are OFF, the bitlines may be coupled to a bitline equalization voltage (e.g., VBLEQ). When either of the monitor cells leak beyond the respective trip points, the signal REFNOW generally activates a refresh in the chip and the cycle starts over.

The reference voltages VLO and VHI are generally selected to balance the desirability of providing a maximum interval between refreshes with providing a margin between the point at which a refresh occurs and the point at which data may be lost. The margin may be determined based upon the signal level that the sense amplifiers of the memory array 106 can detect under worst case conditions. In one example, the reference voltages VLO and VHI may be from about 20 mV to about 100 mV. However, other values may be selected to meet the design of a particular application.

To compensate for monitor cell defects and variations in monitor cell signal retention, redundancy is generally desirable. The redundancy may provide for monitor cell failure recovery and to provide a better chance of finding a weaker memory cell. An array of monitor cells may be implemented and the outputs logically combined.

The present invention may provide advantages including (i) a refresh rate that is set by cell leakage instead of an independent approximation and/or (ii) operation with a supply voltage below 1.8V. The present invention may be applicable to any memory that use an oscillator to control the interval time between refreshing the memory cells. Since the leakage of the cells increases with increasing temperature, the cell leakage can be used to refresh the cell more frequently as the temperature increases. Refreshing proportional to the cell leakage current lowers the operating current when the retention time is better. The present invention may be implemented to provide 1T PSRAM proportional to temperature refreshes.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an array of memory cells;
   a refresh circuit configured to refresh said array in response to a refresh control signal;
   a first monitor cell configured to have a charge leakage similar to said memory cells;
   a second monitor cell configured to have a discharge leakage similar to said memory cells;
   a control circuit configured to generate said refresh control signal in response to either a voltage level of said first monitor cell rising above a first pre-determined threshold level or a voltage level of said second monitor cell dropping below a second pre-determined threshold level, wherein said first and said second threshold levels are different.

2. The apparatus according to claim 1, wherein said control circuit comprises:
   a first comparator circuit configured to generate a first control signal in response to said voltage level of said first monitor cell rising above said first pre-determined threshold level;

a second comparator circuit configured to generate a second control signal in response to said voltage level of said second monitor cell rising above said second pre-determined threshold level; and a logic circuit configured to generate said refresh control signal in response to said first and said second control signals.

3. The apparatus according to claim 2, wherein said logic circuit comprises a one-shot circuit configured to generate said refresh control signal having a predetermined pulse width.

4. The apparatus according to claim 1, wherein said control circuit is configured to operate with both symmetrical and asymmetrical charge and discharge leakages.

5. The apparatus according to claim 1, wherein said first monitor cell and said second monitor cell comprise memory cells that are structurally similar to memory cells of said array.

6. The apparatus according to claim 5, wherein said monitor cells are configured to have a similar environment to said memory cells of said array.

7. The apparatus according to claim 6, wherein a bitline of said first monitor cell and a bitline of said second monitor cell are set to an equalization potential of said array during a monitoring operation.

8. The apparatus according to claim 1, further comprising:

a plurality of monitor cells configured to have a charge leakage similar to said memory cells;

a plurality of monitor cells configured to have a discharge leakage similar to said memory cells, wherein said control circuit is further configured to generate said refresh control signal in response to any of said monitor cells exceeding a respective one of said first pre-determined threshold level or said second pre-determined threshold level.

9. The apparatus according to claim 1, wherein said first monitor cell and said second monitor cell comprise memory cells of said array.

10. The apparatus according to claim 1, wherein said array of memory cells comprises 1T memory cells.

11. The apparatus according to claim 1, further comprising a sense amplifier configured to program said first monitor cell with a first binary value and said second monitor cell with a second binary value in response to said refresh control signal.

12. An apparatus for controlling a refresh of a memory array comprising:

means for monitoring a charge leakage of an array of memory cells;

means for monitoring a discharge leakage of an array of memory cells; and means for generating a refresh control signal in response to either a voltage level of said first monitoring means rising above a first pre-determined threshold level or a voltage level of said second monitoring means dropping below a second pre-determined threshold level, wherein said first and second threshold levels are different.

13. A method for controlling a refresh operation of a memory array comprising the steps of:

monitoring a charge leakage of a first monitor cell;

monitoring a discharge leakage of a second monitor cell; and generating a refresh control signal in response to either a voltage level of said first monitor cell rising above a first pre-determined threshold level or a voltage level of said second monitor cell dropping below a second pre-determined threshold level, wherein said first and second pre-determined threshold levels are different.

14. The method according to claim 13, further comprising the steps of:

programming said first monitor cell with a first binary value; and programming said second monitor cell with a complement of said first binary value.

15. The method according to claim 13, further comprising the step of:

equalizing a bitline voltage level of said first monitor cell and a bitline voltage level of said second monitor cell with a bitline equalization voltage level of said memory array.

16. The method according to claim 13, further comprising the steps of:

generating a first control signal in response to a comparison of a voltage level of said first monitor cell to said first pre-determined threshold level; and generating a second control signal in response to a comparison of a voltage level of said second monitor cell to said second pre-determined threshold level.

17. The method according to claim 13, further comprising the step of:

generating said refresh control signal having a predetermined pulse width.

18. The method according to claim 13, further comprising the step of:

selecting said first and said second predetermined threshold levels to provide a margin between a refresh operation and a loss of retention.

19. The method according to claim 18, wherein said first and said second predetermined thresholds are selected to balance maximizing a period between refresh operations and providing said margin.

20. The method according to claim 13, further comprising the step of:

refreshing a first stored value of said first monitor cell and a second stored value of said second monitor cell in response to said refresh control signal.

* * * * *